(12) United States Patent
Zhang et al.

(10) Patent No.: US 10,790,848 B2
(45) Date of Patent: Sep. 29, 2020

(54) SEGMENTED RESISTIVE DIGITAL TO ANALOG CONVERTER

(71) Applicant: NXP USA, INC., Austin, TX (US)

(72) Inventors: Yizhong Zhang, Suzhou (CN); Stefano Pietri, Austin, TX (US); James Robert Feddeler, Lake Village, IN (US); Michael Todd Berens, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/237,724

(22) Filed: Jan. 1, 2019

(65) Prior Publication Data
US 2019/0372586 A1 Dec. 5, 2019

(30) Foreign Application Priority Data

Jun. 4, 2018 (CN) .......................... 2018 1 0567631

(51) Int. Cl.
| | | |
|---|---|---|
| *H03M 1/66* | (2006.01) | |
| *H03M 1/68* | (2006.01) | |
| *H03M 1/74* | (2006.01) | |
| *H03M 1/78* | (2006.01) | |
| *H03M 7/16* | (2006.01) | |

(52) U.S. Cl.
CPC ........... *H03M 1/687* (2013.01); *H03M 1/747* (2013.01); *H03M 1/78* (2013.01); *H03M 7/165* (2013.01)

(58) Field of Classification Search
CPC ...... H03M 1/765; H03M 1/785; H03M 1/682; H03M 1/687; H03M 1/0682; H03M 1/68; H03M 1/808; H03M 1/1061; H03M 1/76; H03M 1/78

USPC ......................................... 341/144, 145, 154
See application file for complete search history.

(56) References Cited

U.S. PATENT DOCUMENTS

| | | | |
|---|---|---|---|
| 3,307,173 A | 2/1967 | Popodi et al. | |
| 3,508,249 A | 4/1970 | Gordon | |
| 5,119,095 A * | 6/1992 | Asazawa | H03M 1/785 341/118 |

(Continued)

FOREIGN PATENT DOCUMENTS

EP 2019490 A1 1/2009

OTHER PUBLICATIONS

Wei Xu, Runxi Zhang and Chunqi Shi, "Research of Segmented 8 bit Voltage-Mode R-2R Ladder DAC", IEEE 11th International Conference on ASIC (ASICON), 2015.

(Continued)

*Primary Examiner* — Linh V Nguyen

(57) ABSTRACT

A digital to analog converter (DAC) that receives a binary coded signal and generates an analog output signal includes a binary-to-thermometer decoder and a resistive network. The decoder receives the binary coded signal, and decodes it into thermometer signals. The resistive network has branches that are coupled to an output terminal of the DAC in response to the thermometer signals. Each of the branches includes first and second resistors, and a switch. The first resistor is coupled between a first reference voltage and the switch, and the second resistor is coupled between a second reference voltage and the switch. The switch couples either the first resistor or the second resistor to the output terminal in response to a corresponding thermometer signal.

20 Claims, 3 Drawing Sheets

(56) References Cited

U.S. PATENT DOCUMENTS

| | | | |
|---|---|---|---|
| 5,283,580 A * | 2/1994 | Brooks | H03M 1/682 341/145 |
| 5,627,537 A | 5/1997 | Quinlan et al. | |
| 6,297,759 B1 | 10/2001 | Lewyn | |
| 6,331,830 B1 | 12/2001 | Song et al. | |
| 6,448,916 B1 | 9/2002 | Leung | |
| RE38,083 E | 4/2003 | Ashe | |
| 6,633,246 B1 | 10/2003 | Bowers | |
| 6,975,261 B1 * | 12/2005 | Isham | H03M 1/068 341/144 |
| 7,242,338 B2 | 7/2007 | Jiang et al. | |
| 7,336,211 B1 * | 2/2008 | Lai | H03M 1/06 341/118 |
| 8,188,899 B2 | 5/2012 | Motamed | |
| 8,581,766 B1 | 11/2013 | Li et al. | |
| 8,618,971 B1 | 12/2013 | Li | |
| 9,083,380 B2 | 7/2015 | Price et al. | |
| 9,178,524 B1 | 11/2015 | Lee | |
| 9,614,542 B2 | 4/2017 | Worley et al. | |
| 9,819,357 B1 * | 11/2017 | Guo | H03M 1/0607 |
| 9,991,900 B1 | 6/2018 | Kabir et al. | |
| 10,110,244 B1 * | 10/2018 | Pietri | H03M 1/682 |
| 2006/0092066 A1 * | 5/2006 | Pan | H03M 1/0602 341/154 |
| 2008/0055135 A1 | 3/2008 | Li et al. | |
| 2008/0186215 A1 * | 8/2008 | Brubaker | H03M 1/1061 341/121 |
| 2009/0146856 A1 * | 6/2009 | Chen | H03M 1/687 341/154 |
| 2011/0122008 A1 | 5/2011 | Mahooti et al. | |
| 2012/0133538 A1 * | 5/2012 | Choi | G11C 13/0002 341/154 |
| 2013/0222169 A1 * | 8/2013 | Suzuki | H03M 1/68 341/154 |
| 2014/0132435 A1 * | 5/2014 | Dempsey | H03M 1/0872 341/154 |
| 2014/0210657 A1 * | 7/2014 | Suzuki | H03M 1/0612 341/154 |
| 2014/0266835 A1 | 9/2014 | Price et al. | |
| 2016/0056834 A1 | 2/2016 | Frank | |
| 2016/0294407 A1 * | 10/2016 | Kikuta | H03M 1/785 |

OTHER PUBLICATIONS

Kester, Walt, "MT-016 Tutorial Basic DAC Architectures III: Segmented DACs", Jan. 1, 2009, pp. 1-6, retrieved from the Internet at http://www.analog.com/media/en/training-seminars/tutorials/MT-016.pdf on Jan. 29, 2015.

* cited by examiner

SEGMENTED RESISTIVE DIGITAL TO ANALOG CONVERTER

BACKGROUND

The present invention generally relates to digital-to-analog converters (DACs), and, more particularly, to a segmented Resistive DAC (R-DAC).

Resistive digital-to-analog converters (R-DACs) are used for monotonic digital-to-analog conversion. However, available R-DACs are limited either in their maximum speed or best available accuracy. For example, a ladder or a segmented ladder R-DAC operates at a maximum speed of only several MS/s (million samples per second) because of the large equivalent series resistance seen from the load. Thus, a power amplifier is required to achieve a reasonable speed.

FIG. 1 is a schematic diagram of a conventional segmented R-DAC 100. The R-DAC 100 includes first and second sub-DACs 102 and 104, and first and second binary-to-thermometer decoders 106 and 108 respectively coupled with the first and second sub-DACs 102 and 104. The R-DAC 100 further includes a termination resistor 110 coupled across the first sub-DAC 102, and a scaling resistor 112 coupled between the first sub-DAC 102 and the second sub-DAC 104. The first sub-DAC 102 includes multiple resistors each having a unit resistance of R, and a first group of switches 114 configured to be switched to couple the corresponding resistors of the first sub-DAC 102 with either a first reference voltage $V_{refl}$ or a second reference voltage $V_{refh}$. The first group of switches 114 are switched in response to a vector $T_1$ generated by the first binary-to-thermometer decoder 106. Similarly, the second sub-DAC 104 includes multiple resistors each having a unit resistance of R, and second group of switches 116 switchable to couple the corresponding resistors of the second sub-DAC 104 with either the first reference voltage $V_{refl}$ or the second reference voltage $V_{refh}$. The second group of switches 116 is switched in response to a vector $T_2$ generated by the second binary-to-thermometer decoder 108.

The first binary-to-thermometer decoder 106 decodes the less-significant-bits (LSBs) $D_1$ of a binary input signal into the thermometer vector $T_1$ with a number of "1"s equal to a value of the LSBs. The second binary-to-thermometer decoder 108 decodes the most-significant-bits (MSBs) $D_2$ of the binary input signal into the thermometer vector $T_2$ with a number of "1"s equal to a value of the MSBs. The scaling resistor 112 coupled between the first sub-DAC 102 and the second sub-DAC 104 provides a portion of an output voltage of the first sub-DAC 102 to a final output $V_{out}$, since LSBs and MSBs contribute in the output $V_{out}$ with different weights. A resistance of the scaling resistor 112 is based on the number of the resistors in the first sub-DAC 102.

The R-DAC 100 does not have to scale each of the resistor stages in the sub-DACs, as compared with R-2R DAC structures. However, in order to keep the R-DAC 100 monotonic, the switches, especially the switches in the second group 116, must have their "on" resistances small enough to be less than a predetermined margin, but switches with low "on" resistances are large in size and consume significant device area, so the corresponding circuit for driving the switches will be prohibitively large.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a digital to analog converter DAC configured to convert a digital input signal into an analog output signal, the digital input signal includes multiple bits of data. The DAC includes a first sub-DAC, a second sub-DAC, and a bridge switcher. The first sub-DAC is configured to receive a first portion of the bits and to convert the first portion of the bits into a first output signal. The second sub-DAC is configured to receive a second portion of the bits and to convert the second portion of the bits into a second output signal. The bridge switcher is coupled between the first sub-DAC and the second sub-DAC. The first output signal is coupled into the analog output signal through the bridge switcher in response to the bridge switcher being switched on.

In another embodiment, the present invention provides a digital to analog converter DAC configured to receive a binary coded signal and to provide an analog output signal at an output terminal in response and corresponds to the binary coded signal. The DAC includes a binary-to-thermometer decoder and a resistive network. The binary-to-thermometer decoder is configured to receive the binary coded signal, and to decode the binary coded signal into thermometer signals. The resistive network includes branches configured to be coupled with the output terminal in response to the thermometer signals. Each of the branches includes a first resistor, a second resistor, and a switcher. The first resistor is coupled between a first reference voltage and the switcher. The second resistor is coupled between a second reference voltage and the switcher. The switcher is configured to couple the first resistor or the second resistor with the output terminal in response to a corresponding thermometer signal.

BRIEF DESCRIPTION OF THE DRAWINGS

So that the manner in which the above recited features of the present invention can be understood in detail, a more detailed description of the invention may be had by reference to embodiments, some of which are illustrated in the appended drawings. The appended drawings illustrate only typical embodiments of the invention and should not limit the scope of the invention, as the invention may have other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 2:
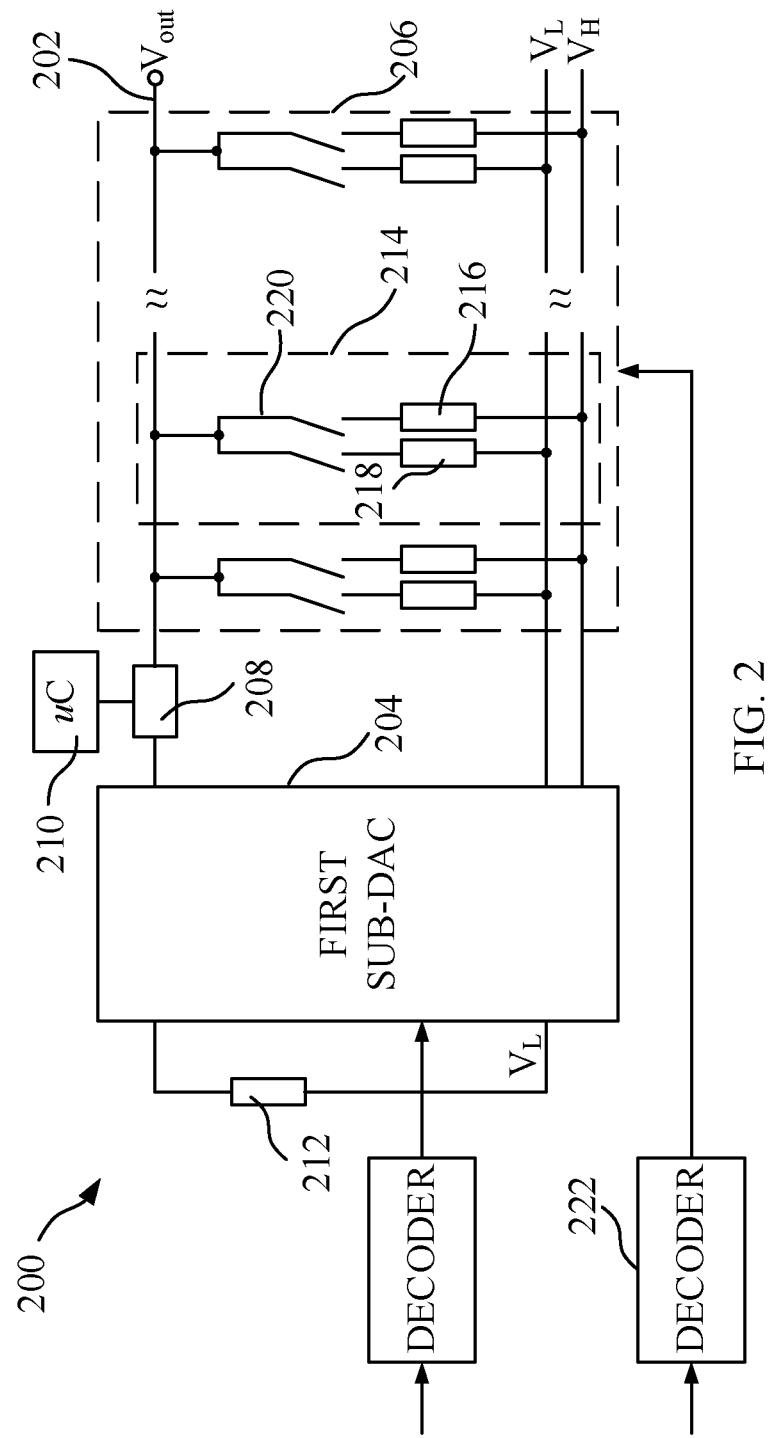
FIG. 2 is a schematic diagram of a DAC according to an embodiment of the present invention.

FIG. 2 shows a schematic diagram of a digital-to-analog converter (DAC) in accordance with an exemplary embodiment of the present invention.

The DAC 200 receives a digital input signal. The digital input signal is a binary coded signal including multiple bits of data indicated as 1's and 0's. The DAC 200 converts the binary coded signal into an analog output signal, and outputs the analog output signal $V_{out}$ at its output terminal 202. In an embodiment that the DAC 200 is a voltage mode DAC, the voltage of the analog output signal $V_{out}$ represents and corresponds to a value of the binary input code signal, which means a larger binary input code is converted by the DAC 200 into an analog output signal $V_{out}$ with higher voltage. For example, for a 3-bit input binary coded signal, a binary input of '110' (i.e., "6") is converted by the DAC 200 to an analog output signal with higher voltage than the analog output signal converted from a binary input of '010' (i.e., 2).

The DAC 200 includes a first sub-DAC 204 and a second sub-DAC 206. The first sub-DAC 204 receives a first portion of the bits of the binary input signal, and the second sub-DAC 206 receives a second portion of the bits of the binary input signal. In response, the first sub-DAC 204 converts the first portion of the bits into a first output signal, and the second sub-DAC 206 converts the second portion of the bits into a second output signal. In the presently preferred embodiment, the first portion of bits are the least significant bits (LSBs) of the binary input signal, and the second portion of bits are the most significant bits (MSBs) of the binary input signal. Both the first and second sub-DACs 204 and 206 are coupled with the output terminal 202, so that the first and second output signals both contribute to the analog output signal.

The DAC 200 further includes a bridge switcher 208 coupled between the first and second sub-DACs 204 and 206. The bridge switcher 208 switches on to provide the first output signal from the first sub-DAC 204 to the analog output signal at the output terminal 202. In applicable embodiments, the bridge switcher 208 is implemented as a transistor, for example a PMOS transistor, an NMOS transistor, or CMOS transistors.

Figure 1:
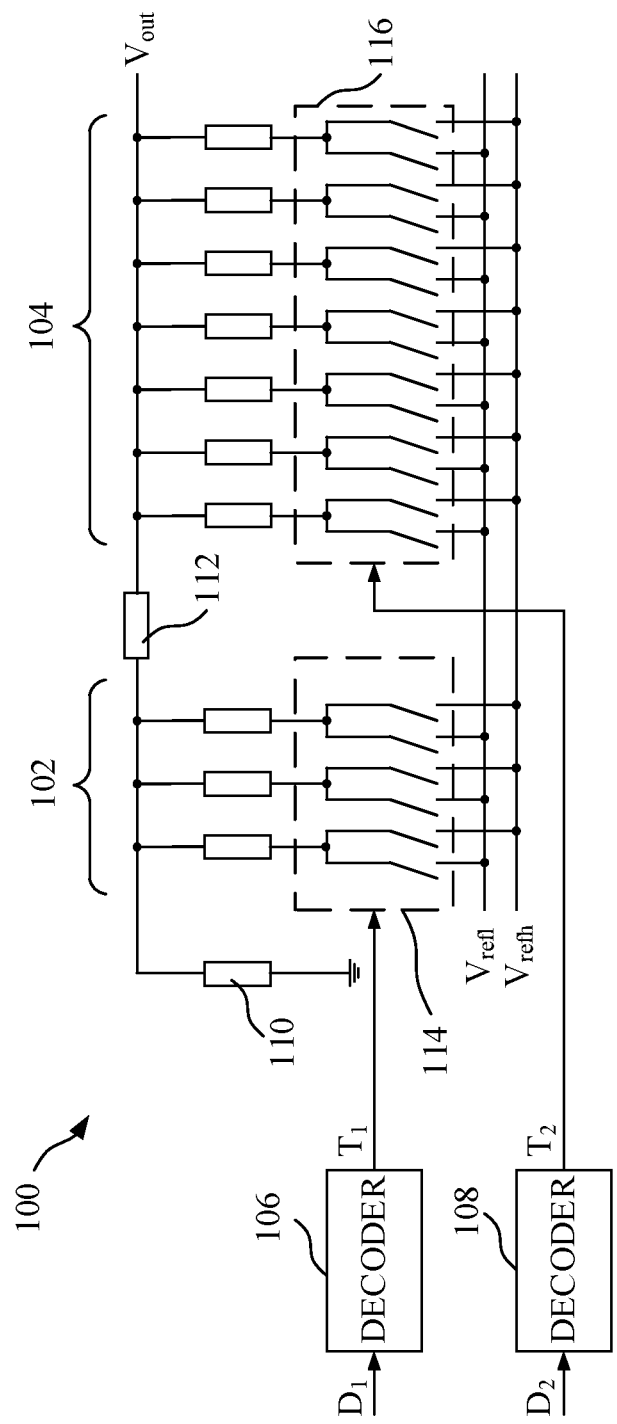
FIG. 1 is schematic circuit diagram of a conventional segmented R-DAC.

The DAC 200 further includes a termination resistor 212 coupled across the first sub-DAC 204, like the termination resistor 110 of FIG. 1.

The second sub-DAC 206 mainly includes a resistive network that couples resistors to draw current from and/or sink current to reference voltage sources (not shown). In the presently preferred embodiment, the reference voltage sources provide a high reference voltage $V_H$ and a low reference voltage $V_L$. The second sub-DAC 206 includes multiple branches 214 that are coupled in parallel with each other. Each of the branches 214 includes a pair of resistors 216 and 218, and a switch 220. One end of the resistor 216 is coupled with the high reference voltage $V_H$, and the other end is coupled with the switch 220. The other end of the switch 220 is coupled with the output terminal 202. Similarly, one end of the resistor 218 is coupled with the low reference voltage $V_L$, and the other end is coupled with the switch 220. Unlike the group of switches 114 of FIG. 1 that are coupled with the high reference voltage and the low reference voltage, the switch 220 of the present invention is a common node switch coupled with the output terminal 202. It can be seen from FIG. 1 that due to the voltage difference between the high and the low reference voltages, the switch in one of the branches is implemented as a PMOS switch for the high reference voltage and an NMOS switch for the low reference voltage, such that the group of switches 114 can operate and function properly in coupling with the different reference voltages. However, PMOS and NMOS transistors having different on resistances cause considerable mismatch amongst the branches. The common node switch 220 of the present invention is configured such that the common node is coupled with the output terminal 202, so that any of a PMOS switch, an NMOS switch, and a CMOS switch may be used, and the mismatch among the branches 214 is thus mitigated. In alternative embodiments, the branches 214 are implemented using one resistor and one switch connected in series between the output terminal 202 and the reference voltage $V_H$ and $V_L$.

In applicable embodiments, the switch 220 and the bridge switcher 208 are the same. Both the switch 220 and the bridge switcher 208 have their respective switch-on resistances. In alternative embodiments, although the switch 220 is different from the bridge switcher 208, their switch-on resistances are the same. Seen from an end of the bridge switcher 208 inwards to the termination resistor 212, an equivalent resistance is $2R+R_{on}$, wherein 2R is the equivalent resistance of a combination of the first sub-DAC 204 and the termination resistor 212, and $R_{on}$ is the switch-on resistance of the bridge switcher 208. An equivalent resistance of the branch 214 is also $2R+R_{on}$, where 2R is the resistance of the resistors 216 and 218, while $R_{on}$ is the switch-on resistance of the switch 220. By having the bridge switcher 208 the same as the switch 220, or by having the bridge switcher 208 to have the same resistance as the switch 220, the mismatch is suppressed, which makes the DAC 200 more accurate and monotonic.

In some embodiment, the bridge switcher 208 is configured to be adjustable. The bridge connection between sub-DACs implemented as the switcher enables the connection to be trimmable/adjustable during manufacturing, which makes the DAC 200 very flexible in meeting requirements for its operational environment.

Normally the bridge switcher 208 is kept closed/conductive to pass the first output signal from the first sub-DAC 204 to the analog output signal at the output terminal 202. However, for a 14-or-more-bit DAC, an optional controller 210 may be used for providing a switch control signal to the bridge switcher 208. Accordingly, the bridge switcher 208 is turned on and off in response to the switch control signal.

The DAC 200 includes a binary-to-thermometer decoder 222. The binary-to-thermometer decoder 222 receives the input binary coded signal, and decodes it to a thermometer code. That is, the decoder 222 receives a binary value and provides a thermometer coded T vector, which includes, from the LSB to the MSB, a number of 1's equal to the input binary value. If the binary value is a 2-bit value, the thermometer coded data vector T would be a 3-bit value, and if the binary value is a 3-bit value, the thermometer coded data vector T would be a 7-bit value. For example, if the binary input is 0b00, then the thermometer coded data vector would be "000". A binary input of 0b01 would provide a thermometer coded data vector of "100", a binary input of 0b10 would provide a thermometer coded data vector of "110", and a binary input of 0b11 would provide a thermometer coded data vector of "111" (i.e., three is because the binary input value was 3). Similarly, if the binary input is 0b001, then the thermometer coded data vector is "1000000"; if the binary input is 0b100, then the thermometer coded data vector is "1111000"; and if the binary input is 0b110, then the thermometer coded data vector is "1111110" (i.e., six is because the binary value was 6). The thermometer-to-binary decoder 222 is configured to receive a digital input signal in binary format and provide vector bits with the number of vector bits set to 1 equal to the digital input data starting at bit 0 (i.e., the LSB).

The DAC 200 may include more than one binary-to-thermometer decoder 222 each for a corresponding sub- DAC. For the present embodiment, the binary-to-thermometer decoder 222 is coupled with the second sub-DAC 206. The input binary coded signal includes first and second portions of binary codes. Preferably, the first portion includes the LSBs, and the second portion includes the MSBs. The second portion of binary codes is provided to the binary-to-thermometer decoder 222, to be decoded into the thermometer code that is used to control the switches 220 of the branches 214.

Similarly, the first sub-DAC 204 can be implemented as having the similar configuration as the second sub-DAC 206. In alternative embodiments, the first sub-DAC 204 are implemented to be applicable digital-to-analog converters, such as R-2R DACs, or segmented 2R DACs, etc. Through allowing the first and the second sub-DACs 204 and 206 to be configured differently, mismatch between the switches and the resistors of the sub-DACs will not negatively impact the output signal. Considering the quantity of elements required in calibrating the mismatch, the different configurations of sub-DACs enable the DAC 200 to have flexible design margin, and the design and manufacture efforts required for harmonization are reduced.

Figure 3:
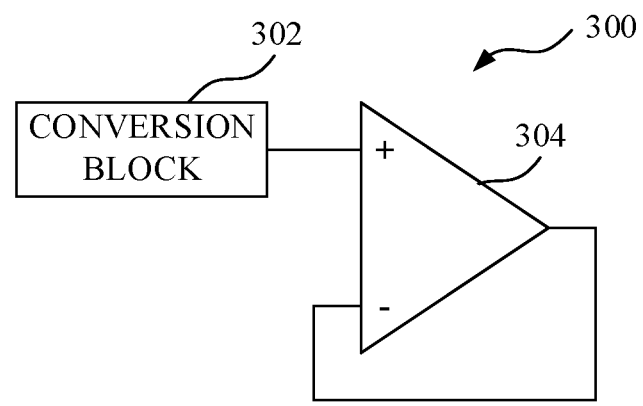
FIG. 3 is a schematic diagram of a DAC according to an embodiment of the present invention.

Referring now to FIG. 3, a schematic block diagram of a DAC according to another embodiment of the present embodiment is shown. The DAC 300 includes a conversion block 302 and a summing circuit 304. In the presently preferred embodiment, the conversion block 302 is implemented using the DAC 200 of FIG. 2, where an output of the conversion block 302 is coupled to the summing circuit 304. The summing circuit 304 may comprise an operational amplifier having a non-inverting input terminal that receives the output of the conversion block, an inverting input terminal, and an output terminal, where the output terminal is connected to the inverting input terminal of the op-amp 304. The op-amp 304 sums the signals from the sub-DACs to generate an analog output signal that reflects the value of the input binary coded signal.

Figure 4:
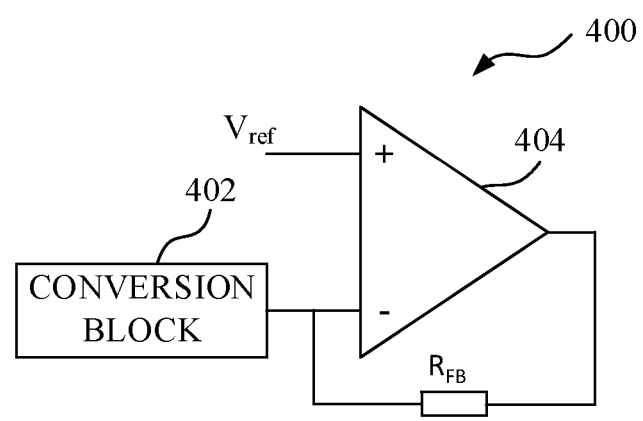
FIG. 4 is a schematic diagram of a DAC according to an embodiment of the present invention.

FIG. 4 shows another exemplary embodiment of a DAC 400 in accordance with the present invention. The DAC 400 includes a conversion block 402, which can be implemented using the DAC 200 of FIG. 2, and a summing circuit 404, which may comprise an op-amp having an inverting input terminal, a non-inverting input terminal, and an output terminal. The inverting input terminal is coupled to the conversion block 402. The non-inverting input terminal is coupled to a reference voltage (Vref), which is an average of the high reference voltage $V_H$ and the low reference voltage $V_L$. The output terminal is coupled with the inverting input terminal by way of a feedback resistor. Referring back to FIG. 2, if the resistors 216 and 218 in the branches 214 have resistances of 2R, the resistance of the feedback resistor is $2R/2^M$, where M is the number of bits provided to the second sub-DAC 206. The DAC 400 accordingly provides a highly accurate buffered voltage mode DAC.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A digital to analog converter (DAC) that converts a multi-bit digital input signal into an analog output signal at an output terminal, the DAC comprising:
   a first sub-DAC configured to receive a first portion of the bits of the multi-bit input signal, and convert the first portion of the bits into a first output signal;
   a second sub-DAC configured to receive a second portion of the bits of the multi-bit input signal, and convert the second portion of the bits into a second output signal, where the second sub-DAC comprises a resistive network comprising branches connected directly with the output terminal and controlled by the second portion of the bits, wherein each of the branches comprises a parallel set of first and second resistors connected to a switcher having a common node connected directly to the output terminal, a first node connected across the first resistor to a first reference voltage, and a second node connected across the second resistor to a second reference voltage, and wherein the switcher is configured to couple one of the first resistor or the second resistor with the output terminal in response to the second portion of the bits; and
   a bridge switcher connected between the first sub-DAC and the second sub-DAC, wherein the first output signal is coupled to the analog output signal through the bridge switcher when the bridge switcher is switched on and is disconnected from the analog output signal when the bridge switcher is switched off.

2. The DAC of claim 1, wherein the bridge switcher is switched on in response to a switch control signal.

3. The DAC of claim 1, wherein the bridge switcher has a switch-on resistance.

4. The DAC of claim 1, wherein bridge switcher is one of a group consisting of a PMOS transistor, a NMOS transistor, and a CMOS transistor.

5. The DAC of claim 1, wherein:
   the first sub-DAC comprises at least one switch and at least one resistor, the at least one switch is coupled between the bridge switcher and the at least one resistor, and the at least one resistor is coupled between the at least one switch and a reference voltage.

6. The DAC of claim 1, wherein the switcher is one of a group consisting of a PMOS transistor, a NMOS transistor, and a CMOS transistor.

7. The DAC of claim 1, wherein the switcher has a switch-on resistance.

8. The DAC of claim 7, wherein the switch-on resistance of the switcher equals a switch-on resistance of the bridge switcher.

9. The DAC of claim 5, wherein the first sub-DAC comprises at least two resistors, wherein one of the at least two resistors is coupled between the at least one switch and a low reference voltage, and the other one of the at least two resistors is coupled between the at least one switch and a high reference voltage.

10. The DAC of claim 1, further comprising a binary-to-thermometer decoder configured to (i) receive the second portion of the bits, (ii) decode the second portion of the bits into a thermometer code, and (iii) provide the decoded thermometer code to the branches so that the switcher in each branch in response to the thermometer code.

11. The DAC of claim 1, further comprising an amplifier having an inverting input terminal, a non-inverting input terminal, and an output terminal, wherein the non-inverting input terminal is coupled to receive the analog output signal, and the output terminal is coupled with the inverting input terminal.

12. The DAC of claim 1, further comprising an amplifier having an inverting input terminal, a non-inverting input terminal, and an output terminal, wherein the non-inverting input terminal is coupled to receive a reference voltage, the inverting input terminal is coupled to receive the analog output signal, and the output terminal is coupled with the inverting input terminal by way of a feedback resistor.

13. The DAC of claim 12, wherein the second sub-DAC comprises at least one switch and at least one resistor, wherein the at least one switch is configured to couple one of a high reference voltage or a low reference voltage to the inverting input terminal of the amplifier by way of the at least one resistor.

14. The DAC of claim 13, wherein the reference voltage is an average of the high reference voltage and the low reference voltage.

15. The DAC of claim 13, wherein a resistance of the feedback resistor is 2R/2M, where 2R is a resistance of the at least one resistor, and M equals a number of bits provided to the second sub-DAC.

16. A digital to analog converter (DAC) configured to receive a binary coded signal and generate an analog output signal at an output terminal that corresponds to the binary coded signal, wherein the DAC comprises:
 a binary-to-thermometer decoder configured to receive the binary coded signal, and decode the binary coded signal into thermometer signals; and
 a resistive network comprising branches connected directly with the output terminal and controlled by the thermometer signals, wherein each of the branches comprises a parallel set of first and second resistors connected to a switcher having a common node connected directly to the output terminal, a first node connected across the first resistor to a first reference voltage, and a second node connected across the second resistor to a second reference voltage, and wherein the switcher is configured to couple one of the first resistor or the second resistor with the output terminal in response to a corresponding thermometer signal.

17. The DAC of claim 16, wherein the switcher comprises two switches respectively coupled with the first and the second resistors.

18. The DAC of claim 16, wherein the switcher is one of a PMOS transistor, a NMOS transistor, and a CMOS transistor.

19. The DAC of claim 16, where the binary-to-thermometer decoder comprises a second sub-DAC that is connected over a bridge switcher to a first sub-DAC, wherein each of the first and second sub-DAC comprises a corresponding binary-to-thermometer decoder and a corresponding resistive network configured to convert first and second portions of binary codes of the binary coded signal into analog signals, and to provide the analog signals to the output terminal, wherein the common node of the switcher is connected directly to the bridge switcher, and wherein the bridge switcher is the same as the switcher of branches of the second sub-DAC.

20. The DAC of claim 19, wherein the first portion of binary codes comprise least significant bits of the binary codes, and the second portion of binary codes comprises most significant bits of the binary codes.

\* \* \* \* \*